US008507974B2

(12) United States Patent
Liu

(10) Patent No.: US 8,507,974 B2
(45) Date of Patent: Aug. 13, 2013

(54) FIN-LIKE FIELD EFFECT TRANSISTOR (FINFET) NON-VOLATILE RANDOM ACCESS MEMORY (NVRAM) DEVICE WITH BOTTOM ERASE GATE

(75) Inventor: Po-Wei Liu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 84 days.

(21) Appl. No.: 13/115,402

(22) Filed: May 25, 2011

(65) Prior Publication Data
US 2012/0299098 A1  Nov. 29, 2012

(51) Int. Cl.
*H01L 29/792* (2006.01)
(52) U.S. Cl.
USPC .... 257/326; 257/324; 257/347; 257/E21.243; 257/E21.21; 257/E29.309; 438/514
(58) Field of Classification Search
USPC .......... 257/324, 347, E29.309, 326, E21.243, 257/E21.21; 438/514
See application file for complete search history.

(56) References Cited

U.S. PATENT DOCUMENTS

| 7,087,952 | B2 | 8/2006 | Zhu et al. |
| 7,091,551 | B1 | 8/2006 | Anderson et al. |
| 7,416,941 | B2 | 8/2008 | Anderson et al. |
| 7,736,965 | B2 | 6/2010 | Cheng et al. |
| 2007/0014151 | A1* | 1/2007 | Zhang et al. ............. 365/185.01 |

* cited by examiner

*Primary Examiner* — Julio J Maldonado
*Assistant Examiner* — Amar Movva
(74) *Attorney, Agent, or Firm* — Haynes and Boone, LLP

(57) ABSTRACT

A FinFET device and method for fabricating a FinFET device is disclosed. An exemplary FinFET device includes a semiconductor substrate; an insulator layer disposed over the semiconductor substrate; a fin structure disposed over the insulator layer, the fin structure having a source region, a drain region, and a channel region disposed between the source region and the drain region; a gate structure disposed adjacent to the channel region of the fin structure; and a doped region disposed in the semiconductor substrate below the channel region of the fin structure. The gate structure includes a first gate dielectric layer disposed adjacent to the fin structure, a second gate dielectric layer, a charge storing layer disposed between the first gate dielectric layer and the second gate dielectric layer, and a gate electrode layer disposed adjacent to the second gate dielectric layer.

21 Claims, 15 Drawing Sheets

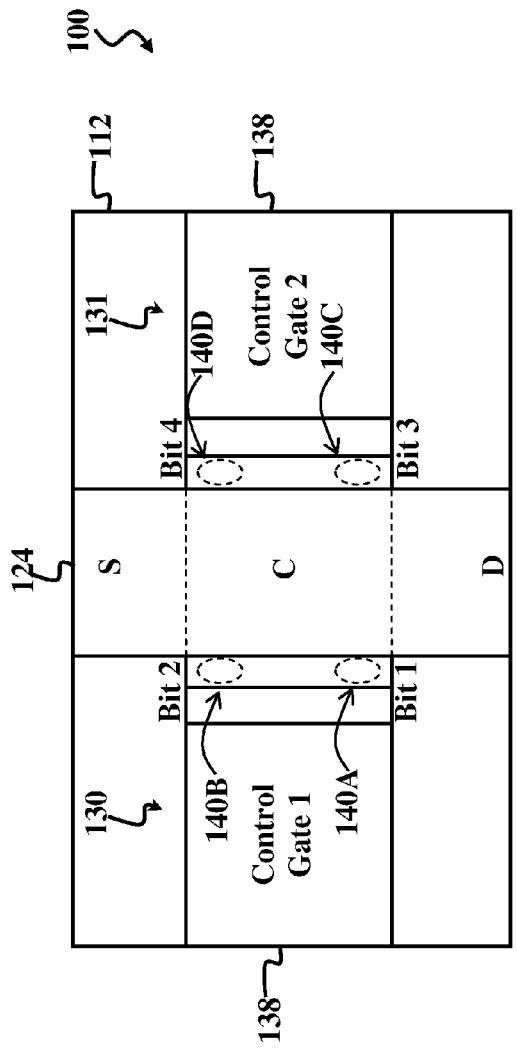
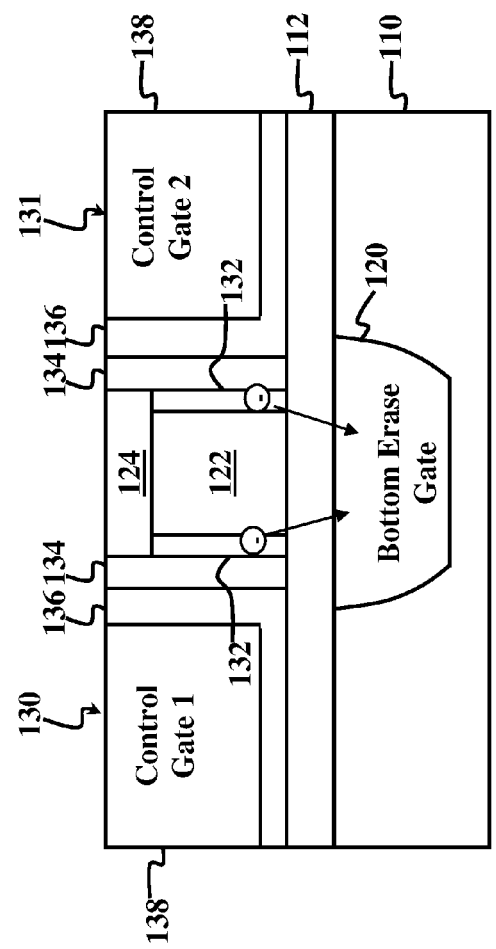

FIN-LIKE FIELD EFFECT TRANSISTOR (FINFET) NON-VOLATILE RANDOM ACCESS MEMORY (NVRAM) DEVICE WITH BOTTOM ERASE GATE

BACKGROUND

As the semiconductor industry has progressed into nanometer technology process nodes in pursuit of higher device density, higher performance, and lower costs, challenges from both fabrication and design have resulted in the development of three dimensional designs, such as fin-like field effect transistors (FinFETs). A typical FinFET is fabricated with a thin "fin" (or fin structure) extending from a substrate, for example, etched into a silicon layer of the substrate. A channel of the FET is formed in this vertical fin. A gate is typically provided on both sides of the channel allowing gate control of the channel from both sides. More recently, FinFET devices have been implemented as memory devices. Although existing FinFET memory devices and methods of fabricating FinFET memory devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1D and FIG. 1E are the diagrammatic top and sectional side views of the integrated circuit devices in FIGS. 1A and 1B, respectively, during operation according to various aspects of the present disclosure.

DETAILED DESCRIPTION

Figure 1A:
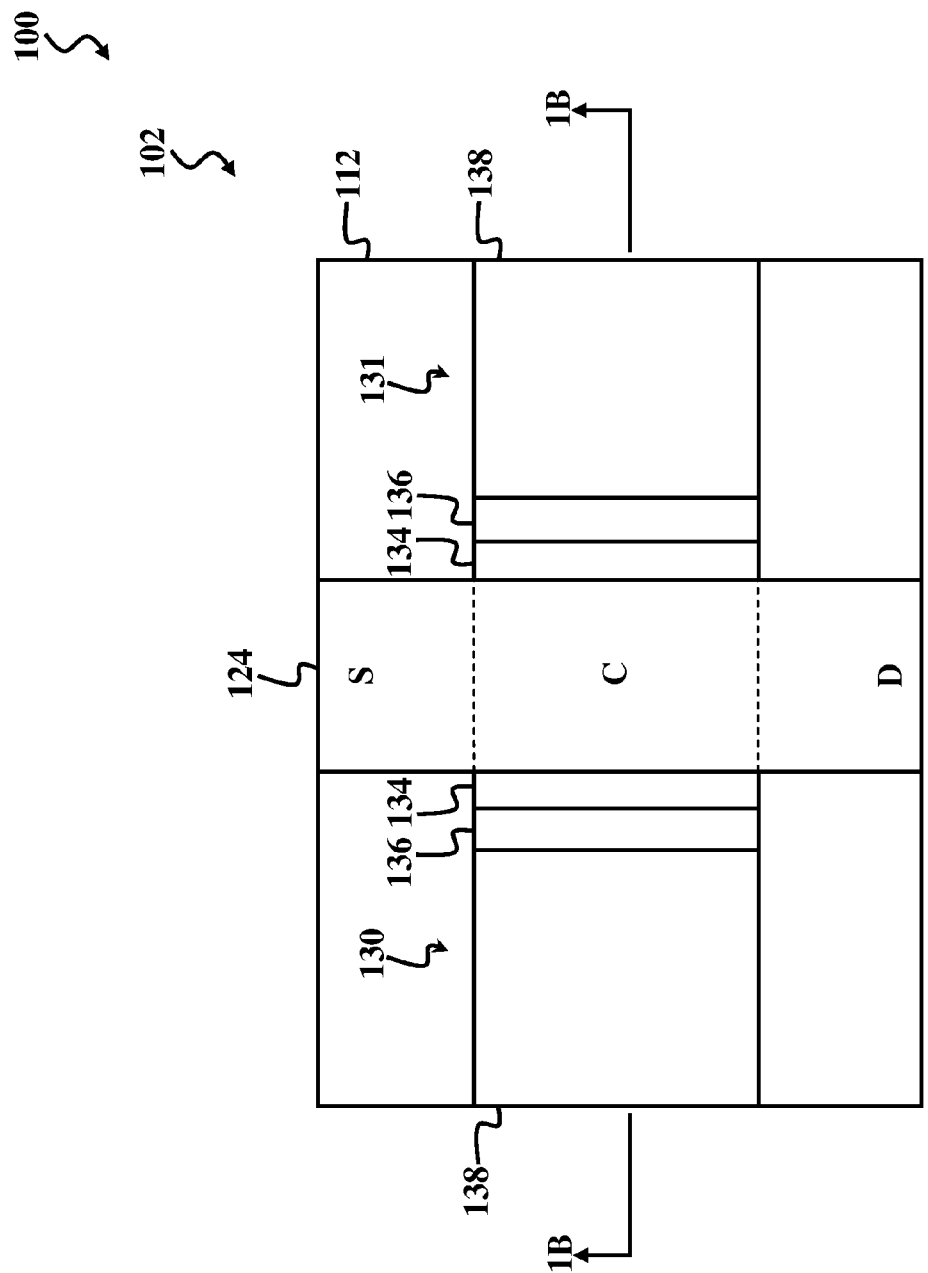
FIG. 1A is a diagrammatic top view of an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1B:
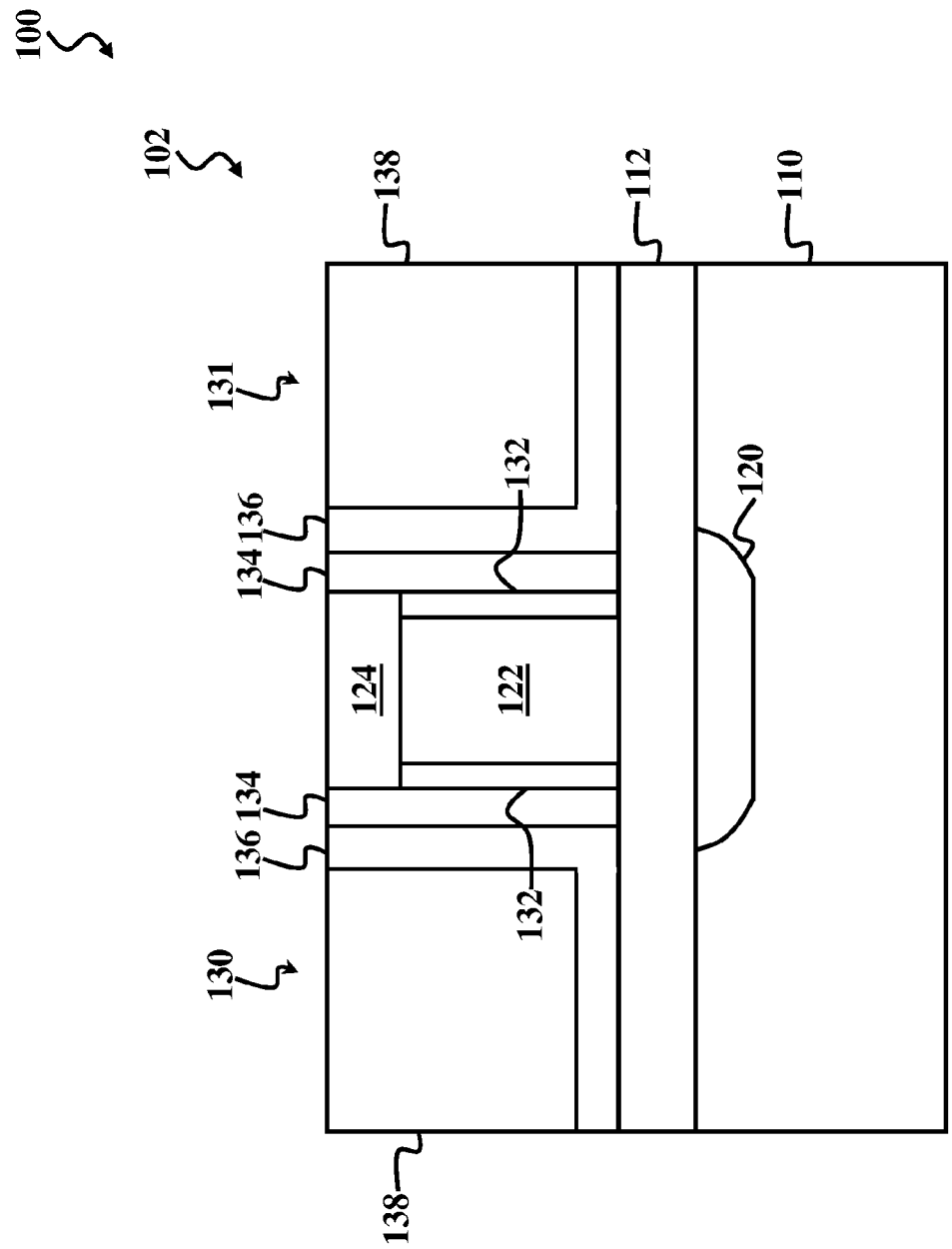
FIG. 1B is a diagrammatic cross-sectional side view of the integrated circuit device of FIG. 1A taken along line 1B-1B according to various aspects of the present disclosure.
Figure 1C:
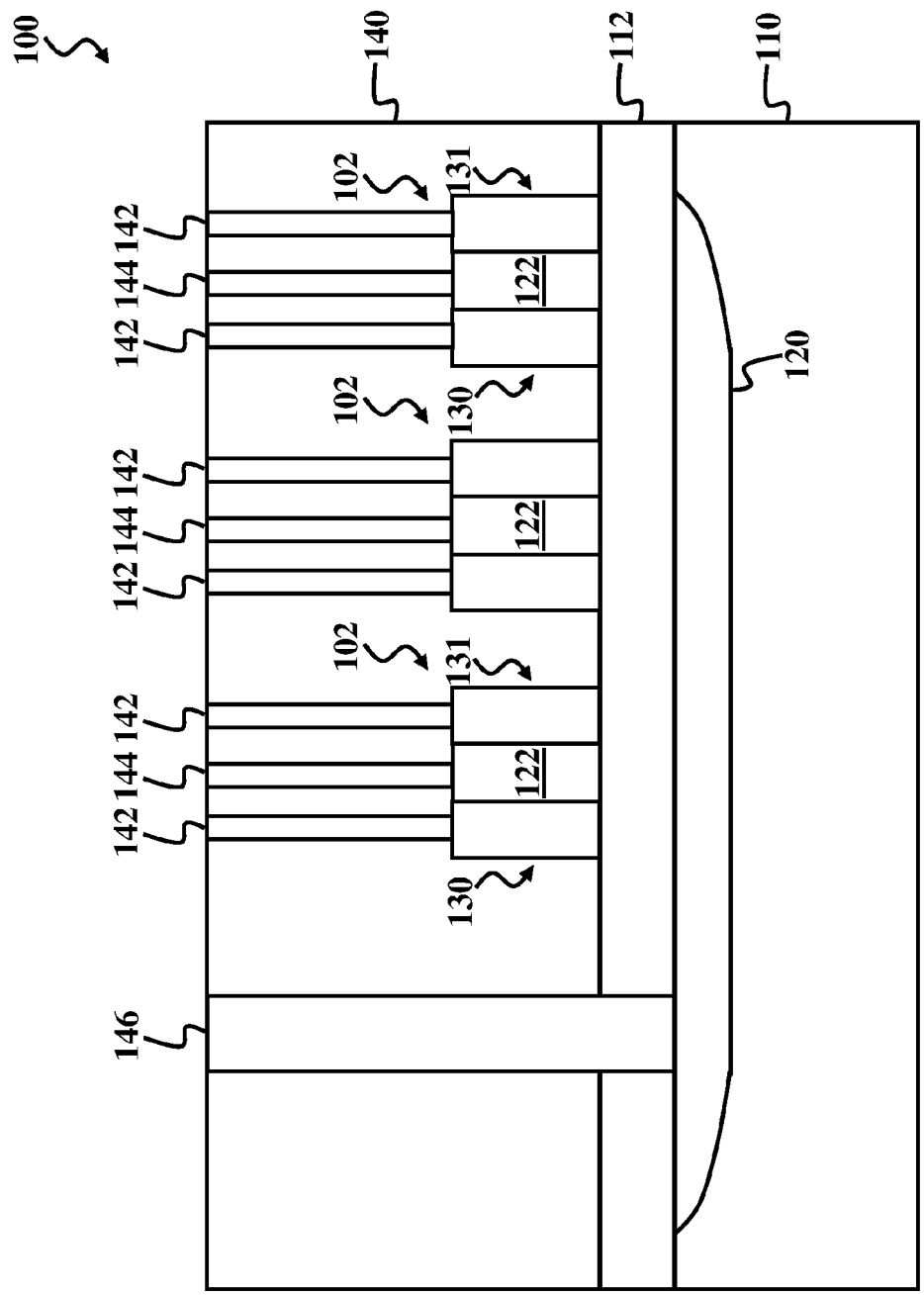
FIG. 1C is a diagrammatic sectional side view of the integrated circuit device of FIG. 1A according to various aspects of the present disclosure.

FIG. 1A is a diagrammatic top view of an embodiment of an integrated circuit device 100, in entirety or portion thereof, according to various aspects of the present disclosure; FIG. 1B is a diagrammatic cross-sectional side view of the integrated circuit device 100, in entirety or portion thereof, taken along line 1B-1B according to various aspects of the present disclosure; and FIG. 1C is a diagrammatic sectional side view of the integrated circuit device 100, in entirety or portion thereof, according to various aspects of the present disclosure. FIGS. 1A, 1B, and 1C will be discussed concurrently and have been simplified for the sake of clarity to better understand the inventive concepts of the present disclosure.

In the depicted embodiment, the integrated circuit device 100 includes at least one fin-like field effect transistor (FinFET) non-volatile random access memory (NVRAM) device. In the depicted embodiment, FIGS. 1A and 1B illustrate a single FinFET NVRAM device 102, and FIG. 1C illustrates several FinFET NVRAM devices 102 of the integrated circuit device 100. Examples of NVRAM include FLASH memory, electrically erasable programmable read only memory (EEPROM), electrically programmable read-only memory (EPROM), and other suitable memory types. The integrated circuit device 100 may be an integrated circuit (IC) chip, system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, high voltage transistors, high frequency transistors, other suitable components, or combinations thereof. Additional features can be added in the integrated circuit device 100, and some of the features described below can be replaced or eliminated for other embodiments of the integrated circuit device 100.

The FinFET NVRAM device 102 includes a substrate 110. In the depicted embodiment, the substrate 110 is a semiconductor substrate including silicon. Alternatively or additionally, the substrate 110 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor substrate 110 may include a doped epi layer, a gradient semiconductor layer, and/or a semiconductor layer overlying another semiconductor layer of a different type, such as a silicon layer on a silicon germanium layer. In the depicted embodiment, the substrate 110 is a p-type doped silicon substrate. P-type dopants that the substrate 110 are doped with include boron, gallium, indium, other suitable p-type dopants, or combinations thereof. Because the depicted FinFET NVRAM device 100 includes a p-type doped substrate, doping configurations described below should be read consistent with a p-type doped substrate. The FinFET NVRAM device 100 may alternatively include an n-type doped substrate, in which case, the doping configurations described below should be read consistent with an n-type doped substrate (for example, read with doping configurations having an opposite conductivity). N-type dopants that the substrate 110 can be doped with include phosphorus, arsenic, other suitable n-type dopants, or combinations thereof.

An insulator layer 112 is disposed over the substrate 110. In the depicted embodiment, the insulator layer 112 is a buried oxide (BOX) layer, such as a silicon oxide layer. Alternatively, the insulator layer 112 includes another suitable dielectric layer. The silicon substrate 110 and BOX layer 112 can be referred to as a silicon-on-insulator (SOI) substrate. In an example, the insulator layer 112 has a thickness of about 100 Å to about 200 Å.

A doped region 120 is disposed in the substrate 110. The doped region 120 is an n-type doped region. Alternatively, the doped region is a p-type doped region. In the depicted embodiment, the doped region 120 is a heavily doped n-type doped region (N+ region). In an example, the doped region 120 has a doping concentration of about $1\times10^{16}$ atoms/cm$^3$ to about $1\times10^{18}$ atoms/cm$^3$. As described in further detail below, the doped region 120 is an erase gate of the FinFET NVRAM device 102. In the depicted embodiment, since the doped region 120 is disposed at a "bottom" portion of the device 100, the doped region 120 may be referred to as a bottom erase gate.

A fin structure 122 is disposed over the substrate 110. In FIG. 1B, the fin structure 122 is disposed over the insulator layer 112 and the doped region 120. In the depicted embodiment, the fin structure 122 is a silicon fin. Alternatively or additionally, the fin structure 122 may include other suitable materials. In an example, the fin structure 122 has a thickness of about 200 Å to about 1,000 Å. Referring to FIG. 1A, the fin structure 122, covered by a hard mask layer 124, includes a source (S), a drain (D), and a channel (C) disposed between the source and drain. In the depicted embodiment, at least the channel (C) of the fin structure 122 is disposed over the doped region 120.

The hard mask layer 124 is disposed over the fin structure 122. In an example, the hard mask layer 124 may be considered a part of the fin structure 122. In the depicted embodiment, the hard mask layer 124 includes silicon oxide. Alternatively or additionally, the hard mask layer 124 includes silicon nitride, silicon oxynitride, silicon carbide, other suitable material, or combinations thereof. In an example, the hard mask layer 124 has a thickness of about 200 Å to about 900 Å.

The FinFET NVRAM device 102 further includes a gate structure 130 and a gate structure 131. The fin structure 122, and the hard mask layer 124 in the depicted embodiment, are disposed between the gate structures 130 and 131. Specifically, the channel region of the fin structure 122 is disposed between the gate structures 130 and 131. The gate structures 130 and 131 include a gate dielectric layer 132, a charge storing layer 134, a gate dielectric layer 136, and a gate electrode layer 138. The gate structures 130 and 131 may include numerous other layers, for example, capping layers, interface layers, diffusion layers, barrier layers, other suitable layers, or combinations thereof.

The gate dielectric layer 132 is disposed along sidewalls of the fin structure 122. In the depicted embodiment, the gate dielectric layer 132 is disposed along sidewalls of the channel (C) of the fin structure 122. In an example, the gate dielectric layer 132 may be disposed along a top surface of the fin structure 122, such that the gate dielectric layer 132 is disposed along three sides of the fin structure 122. The gate dielectric layer 132 includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In the depicted embodiment, the gate dielectric layer 132 is an oxide layer designed to achieve a tunneling effect, and thus, may be referred to as a tunnel oxide layer. In an example, the gate dielectric layer 132 has a thickness of about 30 Å to about 150 Å.

The charge storing layer 134 is disposed adjacent to the gate dielectric layer 132, and in the depicted embodiment, extends adjacent to the hard mask layer 124. As described in further detail below, the charge storing layer 134 is a charge storing node for each gate structure 130, 131 of the FinFET NVRAM device 102. The material of the charge storing layer 134 depends on design requirements of the FinFET NVRAM device 102. For example, if a silicon-oxide-nitride-oxide-silicon (SONOS) memory cell is desired, the charge storing layer 134 includes silicon nitride. If a floating gate is desired, the charge storing layer 134 includes polysilicon. Other materials or combinations of materials may be used for the charge storing layer 134 depending on the design requirements of the FinFET NVRAM device 100. In the depicted embodiment, the charge storing layer 134 includes silicon nitride. In an example, the charge storing layer 134 has a thickness of about 40 Å to about 400 Å.

The gate dielectric layer 136 is disposed adjacent to the charge storing layer 134. In the depicted embodiment, the gate dielectric layer 136 also extends along the insulating layer 112 in a direction perpendicular to the fin structure 122, such that is disposed between the insulator layer 112 and the gate electrode layer 138. The gate dielectric layer 136 isolates the charge storing layer 134 from the gate electrode 138. The gate dielectric layer 136 includes a dielectric material, such as silicon oxide, silicon nitride, silicon oxynitride, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In the depicted embodiment, the gate dielectric layer 132 is a tunnel oxide layer. In an example, the gate dielectric layer 136 has a thickness of about 80 Å to about 200 Å. In the example where the gate dielectric layer 132 is disposed over the top surface of the fin structure 122, such that it is disposed along three sides of the fin structure 122, the charge storing layer 134 and/or gate dielectric layer 136 may also be disposed over the top surface of the fin structure 122, specifically over the gate dielectric layer 132 that is positioned over the top surface of the fin structure 122.

The gate electrode layer 138 is disposed over the gate dielectric layer 136. The gate electrode layer 138 serves as a control gate for each gate structure 130, 131 of the FinFET NVRAM device 102. In the depicted embodiment, the gate electrode layer 138 includes polysilicon. Alternatively or additionally, the gate electrode layer 138 includes a metal including including Al, Cu, Ti, Ta, W, Mo, TaN, NiSi, CoSi, TiN, WN, TiAl, TiAlN, TaCN, TaC, TaSiN, other conductive materials, or combinations thereof. In an example, the gate electrode layer 138 has a thickness of about 300 Å to about 1,000 Å.

Referring to FIG. 1C, the FinFET NVRAM device 100 includes a dielectric layer 140 disposed over the FinFET NVRAM devices 102. In the depicted embodiment, the dielectric layer 140 is an interlayer (or inter-level) dielectric (ILD) that includes silicon oxide. Alternatively or additionally, the dielectric layer 140 includes silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, or combinations thereof.

Contacts 142, 144, and 146 extend through the dielectric layer 140 to couple with various features of the FinFET NVRAM devices 102. For example, the contacts 142 are electrically coupled with the gate structures 130 and 131 of each FinFET NVRAM device 102. In an example, the contacts 142 are electrically coupled with the gate electrode layer 138 of each FinFET NVRAM device 102. The contacts 144 are electrically coupled with the fin structures 122 of each FinFET NVRAM device 102. In the depicted embodiment, contacts 144 are electrically coupled with the source (S) and the drain (D) of the fin structures 122 of each FinFET NVRAM device 102. Further, the contact 146 is electrically coupled with the doped region 120.

The contacts 142, 144, and 146 include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In an example, the contacts 142, 144, and 146 are a portion of a multilayer interconnect (MLI) disposed over the substrate 110. The MLI is coupled to various components of the FinFET NVRAM device 100, such that the various components are operable to function as specified by design requirements of the FinFET NVRAM device 100. The MLI includes various conductive features, which may be vertical interconnects, such as contacts and/or vias, and/or horizontal interconnects, such as lines. The various conductive features include materials similar to the contacts 142, 144, and 146.

In an example, the MLI includes at least one bit line, at least one word line, and at least one erase line. In an example, the contact 146 is electrically coupled with an erase line (not shown) of the MLI. The contact 146 may be considered a portion of the erase line. As described further below, a bias (voltage) may be applied to the erase line electrically coupled with the doped region 120 to erase the FinFET NVRAM devices 102. In an example, the contacts 142 are electrically coupled with a word line. The contacts 142 may be considered a portion of the word line. In an example, at least one of the contacts 144 are electrically coupled with a bit line. The at least one contact 144 may be considered a portion of the bit line.

Various biases are applied to the to the fin structure 122 (specifically the source (S) and the drain (D)), the gate structures 130 and 131 (specifically gate electrodes 138), and the doped region 120 of each FinFET NVRAM device 102 via the contacts 142, 144, and 146 to achieve operation of each FinFET NVRAM device 102. FIG. 1D is a top view, and FIG. 1E is a diagrammatic cross-sectional side view, of the FinFET NVRAM device 102 of the integrated circuit device 100 illustrated in FIGS. 1A and 1B, during operation according to various aspects of the present disclosure. In the depicted embodiment, the FinFET NVRAM device 102 is configured as a four-bit memory cell that can independently write to, read from, or erase four bits of data. The four-bit FinFET NVRAM device 102 includes a control gate 1 (the gate electrode layer 138 at the left side of the device 102), a control gate 2 (the gate electrode layer 138 at the right side of the device 102), the source (S) of the fin structure 122, the drain (D) of the fin structure 122, the channel (C) of the fin structure 122, and a bottom erase gate (the doped region 120). The channel (C) of the fin structure 122 is disposed between the control gates 1 and 2. The bottom erase gate (the doped region 120) is disposed between the control gates 1 and 2 below the fin structure 122, specifically below the channel (C) of the fin structure 122.

The FinFET NVRAM device 102 has charge storage regions 140A (Bit 1), 140B (Bit 2), 140C (Bit 3), and 140D (Bit 4) disposed in the charge storing layer 134. The charge storing region 140A is located between the control gate 1 and the channel, and is adjacent to the drain; the charge storing region 140B is located between the control gate 1 and the channel, and is adjacent to the source; the charge storing region 140C is located between the control gate 2 and the channel, and is adjacent to the drain; and the charge storing region 140D is located between the control gate 2 and the channel, and is adjacent to the source.

In operation, four bits of data may be independently written to, read from, or erased from Bit 1, Bit 2, Bit 3, and Bit 4 by biasing the control gate 1, control gate 2, source (S), drain (D), and/or bottom erase gate via the contacts 142, 144, and/or 146. When a bit is written to, a positive or negative charge is placed on the bit. When a bit is erased, charge is removed form the bit, returning the bit to an uncharged state. Table 1 below provides various biases that may be applied to the control gate 1, control gate 2, source (S), drain (D), and/or bottom erase gate to achieve operation of the FinFET NVRAM device 102 according to various aspects of the present disclosure. Table 1 is merely an example, and various other biases may be applied to the to the control gate 1, control gate 2, source (S), drain (D), and/or bottom erase gate to achieve operation of the FinFET NVRAM device 102.

TABLE 1

| Operation | Control Gate 1 Voltage | Control Gate 2 Voltage | Drain Voltage | Source Voltage | Erase Gate Voltage |
|---|---|---|---|---|---|
| Write Bit 1 | 6 V | 2.5 V | 5 V | 0 V | 5 V |
| Read Bit 1 | 2.5 V | 0 V | 0 V | 0.5 V | 0 V |
| Write Bit 2 | 6 V | 2.5 V | 0 V | 5 V | 5 V |
| Read Bit 2 | 2.5 V | 0 V | 0.5 V | 0 V | 0 V |
| Write Bit 3 | 2.5 V | 6 V | 5 V | 0 V | 5 V |
| Read Bit 3 | 0 V | 2.5 V | 0 V | 0.5 V | 0 V |
| Write Bit 4 | 2.5 V | 6 V | 0 V | 5 V | 5 V |
| Read Bit 4 | 0 V | 2.5 V | 0.5 V | 0 V | 0 V |
| Erase | 0 V | 0 V | 0 V | 0 V | 12 V |

In Table 1, FinFET NVRAM device 102 includes gate dielectric layer 132 being a tunnel oxide layer having a thickness of about 70 Å, and an insulator layer 112 being a BOX layer having a thickness of about 100 Å. Further, the FinFET NVRAM device 102 according to Table 1 is programmed to store negative charge (electrons) in the bit locations (charge storing regions 140A, 140B, 140*c*, and 140D). More specifically, programming the FinFET NVRAM device 102 involves applying various biases to the control gate 1, control gate 2, source (S), drain (D), and/or bottom erase gate, such that electrons tunnel through the gate dielectric layer 132 into the charge storing layer 134. For example, to write to Bit 1, a voltage of about 6 V may be applied to the control gate 1 (via contact 142), a voltage of about 2.5 V may be applied to the control gate 2 (via contact 142), a voltage of about 5 V may be applied to the drain (via contact 144), a voltage of about 0 V may be applied to the source, and a voltage of about 5 V may be applied to the erase gate (via contact 146). To read from Bit 1, a voltage of about 2.5 V may be applied to the control gate 1 (via contact 142), and a voltage of about 0.5 V may be applied to the source (via contact 144). Each of the other bits, Bit 2, Bit 3, and Bit 4, may also be written to or read by applying the various voltages listed in Table 1.

In conventional integrated circuit devices, because the various FinFET NVRAM devices (such as FinFET NVRAM devices 102) are isolated from one another by an insulator layer (such as the BOX layer 112), each FinFET NVRAM device (each memory cell) must be individually erased. Accordingly, conventional integrated circuit devices cannot perform a block erase or a sector erase that can erase more than one FinFET NVRAM device (memory cell) at a time. The disclosed integrated circuit device 100 addresses this issue by providing an erase gate (doped region 120) for each FinFET NVRAM device 102. For example, referring to FIG. 1C, in the depicted embodiment, each FinFET NVRAM device 102 is disposed over the doped region 120. In operation, a voltage is applied to the doped region 120 via contact 146 that can erase each of the FinFET NVRAM devices 102 disposed over the doped region 120. In other words, the integrated circuit device 100 provides block erase or sector erase capability, where more than one memory cell (FinFET NVRAM device 102) can be erased at a time. For example, according to Table 1, to erase the FinFET NVRAM devices 102, a voltage of about 12 V is applied to the erase gate (doped region 120 via contact 146). When an appropriate voltage is applied to the erase gate, in each FinFET NVRAM device 102 associated with the doped region 120, the electrons stored in the charge storing layer 134 tunnel through the insulator layer 112 into the doped region 120. In an example, a high voltage, such as about 11 V to about 13V, is applied to the bottom erase gate of the FinFET NVRAM device 102 to perform an erase. In an example, the voltage applied to the bottom erase gate of the FinFET NVRAM device 102 depends on a thickness of the insulator layer 112. In another example, the FinFET NVRAM devices 102 may be disposed over different doped regions (erase gates), such that the integrated circuit device 100 can selectively erase various FinFET NVRAM devices 102. Further, in contrast to conventional FinFET NVRAM devices, the disclosed configuration of FinFET NVRAM device 100 separates the programming path and the erase path of each FinFET NVRAM device 102 (memory cell), which can reduce tunnel dielectric degradation issues. Separating the programming and erase paths also improves reliability and performance of FinFET NVRAM device 102. Different embodiments may have different advantages, and no particular advantage is necessarily required of any embodiment.

Figure 2:
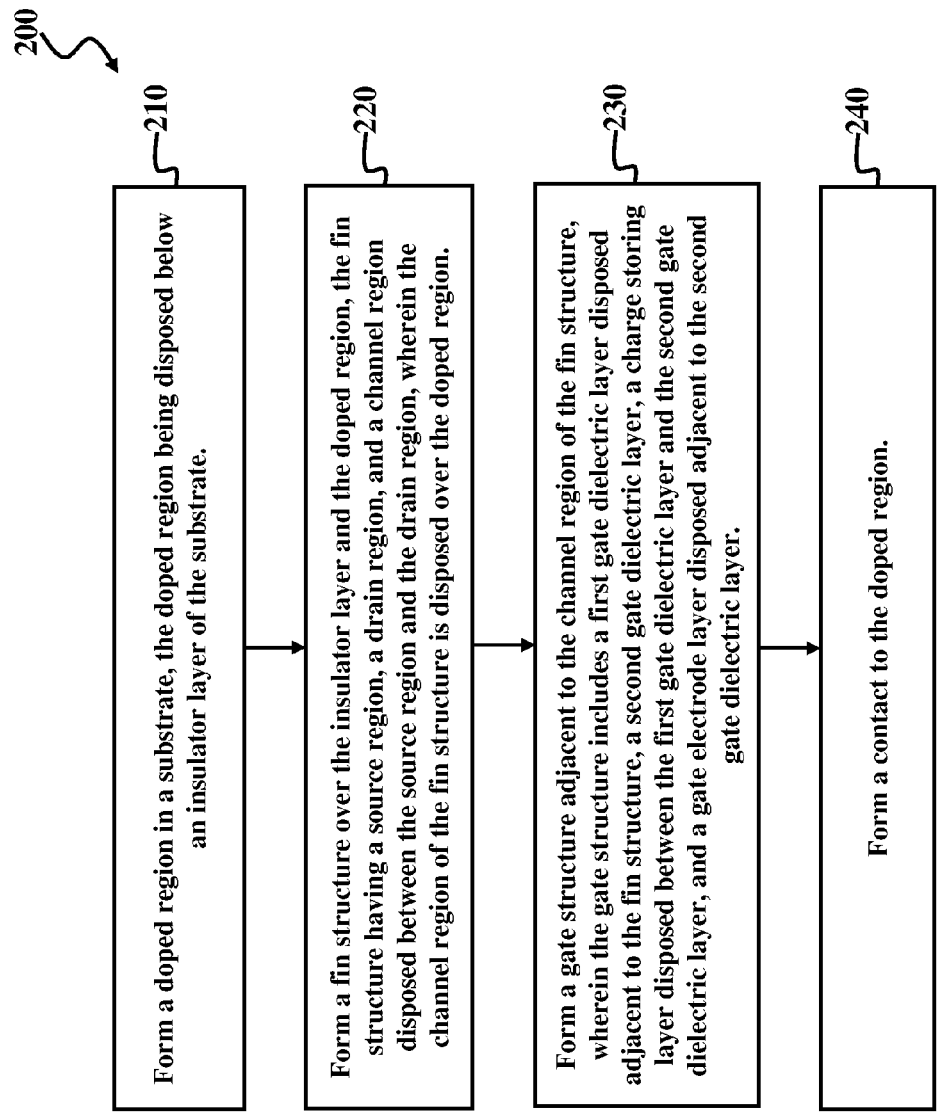
FIG. 2 is a flow chart for fabricating an integrated circuit device according to various aspects of the present disclosure.

FIG. 2 is a flow chart of a method 200 for fabricating an integrated circuit device according to various aspects of the present disclosure. In the present embodiment, the method 200 is for fabricating an integrated circuit device that includes a FinFET NVRAM device, such as integrated circuit device 100 that includes a FinFET NVRAM device 102. The method 200 begins at block 210 where a doped region is formed in a substrate. In the depicted embodiment, an insulator layer is disposed over the substrate, and the doped region is disposed in the substrate below the insulator layer. In an example, the doped region is formed by performing an ion implantation process. At block 220, a fin structure is formed over the insulator layer and the doped region. The fin structure includes a source, a drain, and a channel disposed between the source and the drain. In an example, at least the channel of the fin structure is disposed over the doped region. The method continues with block 230 where a gate structure is formed adjacent to the channel of the fin structure. In an example, the gate structure includes a first gate dielectric layer disposed adjacent to the fin structure, a second gate dielectric layer, a charge storing layer disposed between the first gate dielectric layer and the second gate dielectric layer, and a gate electrode layer disposed adjacent to the second gate dielectric layer. At block 240, a contact is formed to the doped region. In an example, the contact extends through the insulator layer and couples with the doped region. Additional steps can be provided before, during, and after the method 200, and some of the steps described can be replaced or eliminated for other embodiments of the method. The discussion that follows illustrates various embodiments of an integrated circuit device that can be fabricated according to the method 200 of FIG. 2.

FIGS. 3-12 are diagrammatic cross-sectional side views of an integrated circuit device 300, in portion or entirety, at various stages of fabrication according to the method 200 of FIG. 2. In the depicted embodiment, the integrated circuit device 300 is an integrated circuit device that includes a FinFET NVRAM device. The integrated circuit device 300 is similar in many respects to the integrated circuit device 100. Accordingly, similar features in FIGS. 1A-1E are identified by the same reference numerals for clarity and simplicity. FIGS. 3-12 have been simplified for the sake of clarity to better understand the inventive concepts of the present disclosure. Additional features can be added in the integrated circuit device 300, and some of the features described below can be replaced or eliminated in other embodiments of the integrated circuit device 300.

Figure 3:
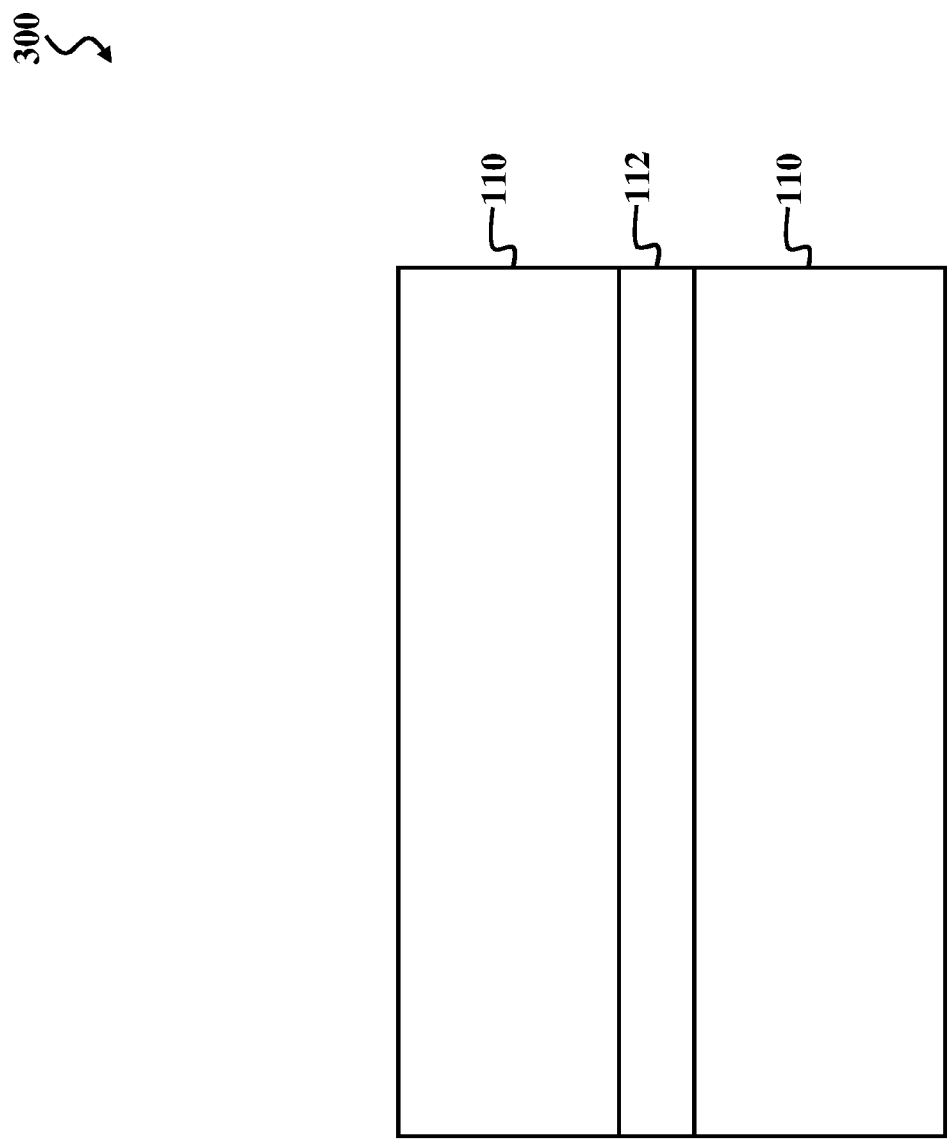
FIGS. 3-12 are diagrammatic cross-sectional side views of an integrated circuit device at various fabrication stages of fabrication according to the method of FIG. 2.
Figure 4:
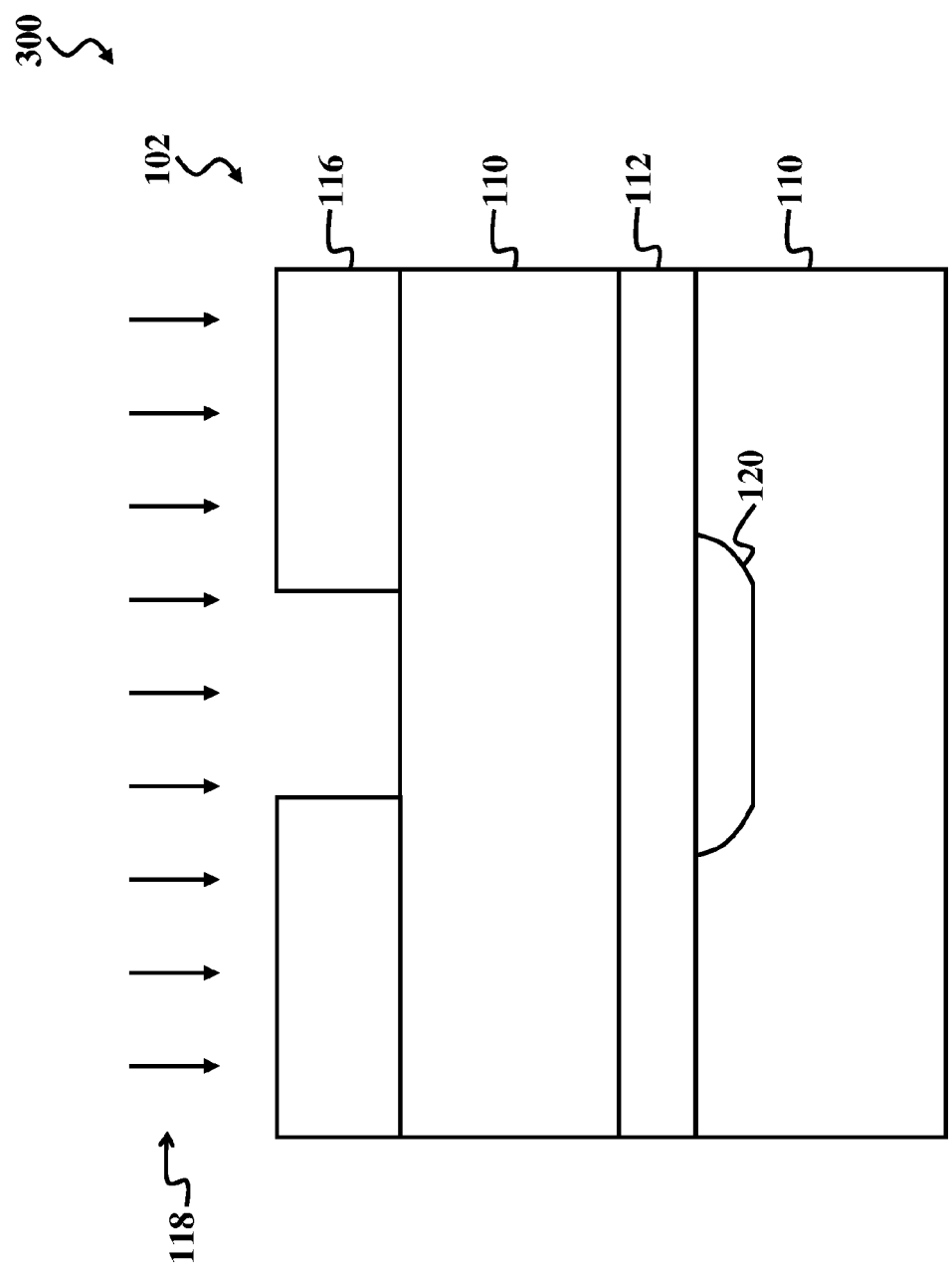

Referring to FIGS. 3 and 4, a doped region is formed in a substrate, specifically below an insulator layer of a substrate. In FIG. 3, the substrate 110 is a silicon-on-insulator substrate, and thus, the substrate 110 includes the insulator layer 112 disposed therein. In the depicted embodiment, the insulator layer 112 is a buried oxide (BOX) layer, such as a silicon oxide layer. In FIG. 4, an ion implantation is performed to form the doped region in the substrate 110 below the insulator layer 112. In an example, a photoresist layer 116 is formed over the substrate 110 and patterned to have an opening therein. An ion implantation process 118 is then performed to form the doped region 120 in the substrate 110 below the insulator layer 112. In the depicted embodiment, the ion implantation process implants dopants through a top silicon portion of the substrate 110 and through the insulator layer 112. The doped region 120 is substantially aligned with the opening in the photoresist layer 116.

Figure 5:
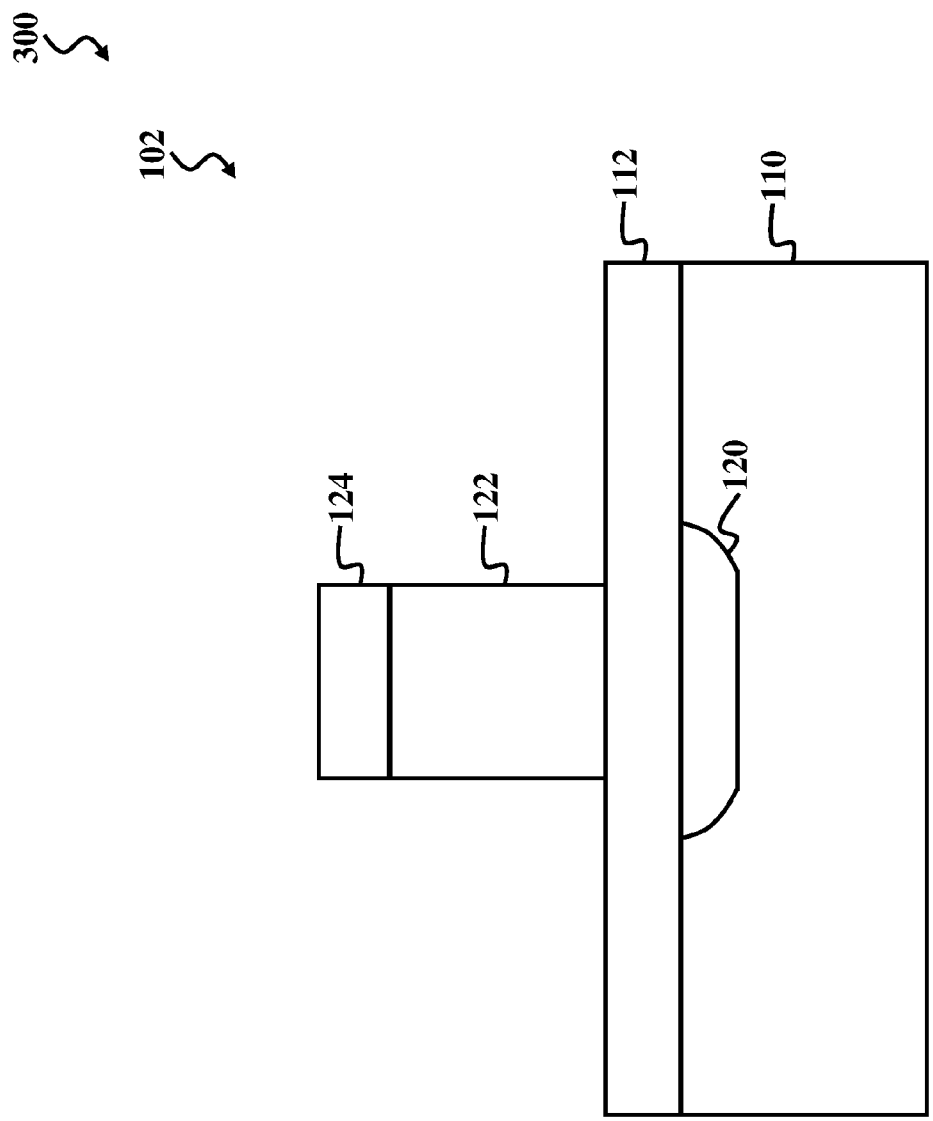

Referring to FIG. 5, a fin structure is formed over the insulator layer and the doped region. In the depicted embodiment, the fin structure 122, such as a Si fin, is a portion of the top silicon portion of the substrate 110. The fin structure 122 is disposed over the doped region 120. The fin structure 122 is formed by a suitable process, such as a lithography and etching process. For example, the fin structure 122 may be formed by forming the hard mask layer 124 over the top silicon portion of the substrate 110, forming a photoresist layer (resist) overlying the hard mask layer 124, exposing the resist to a pattern, performing a post-exposure bake process, and developing the resist to form a masking element including the resist. The masking element may then be used to etch the hard mask layer 124 and the top silicon portion of the substrate 110 to form the fin structure 122 and overlying hard mask layer 124. The fin structure 122 may be etched using a reactive ion etch (RIE) and/or other suitable process. Alternatively, the fin structure 122 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes.

Figure 6:
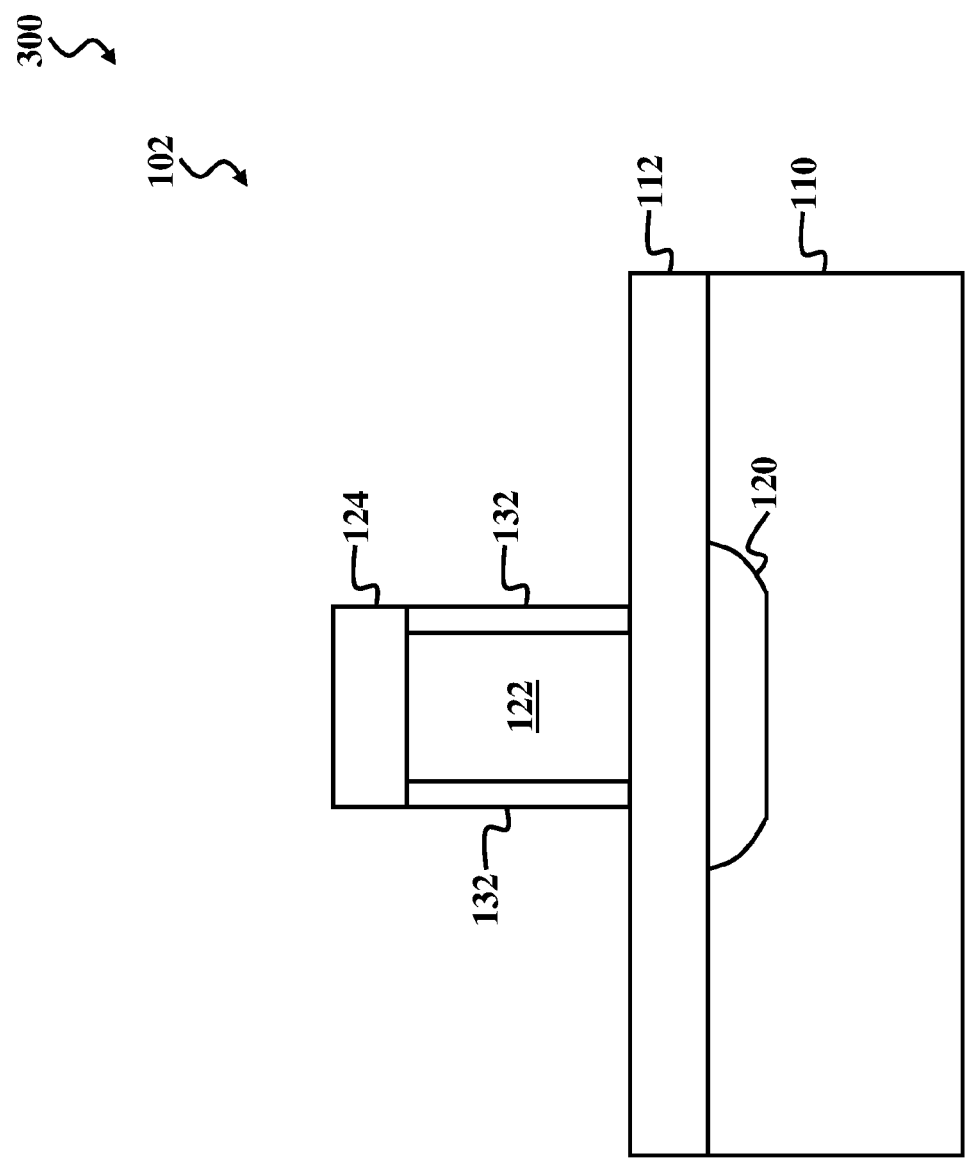

Referring to FIGS. 5-10, a gate structure is formed adjacent to a channel of the fin structure. More specifically, the gate structures 130 and 131 are formed adjacent to the channel of the fin structure 122. In FIG. 6, the gate dielectric layer 132 is formed on sidewalls of the fin structure 122. In the depicted embodiment, the gate dielectric layer 132 is thermally grown on the sidewalls of the fin structure 122. As noted above, the gate dielectric layer 132 is formed to have a thickness that is conducive to a tunneling effect. Alternatively, the gate dielectric layer 132 is formed by other suitable processes, such as those described herein.

Figure 7:
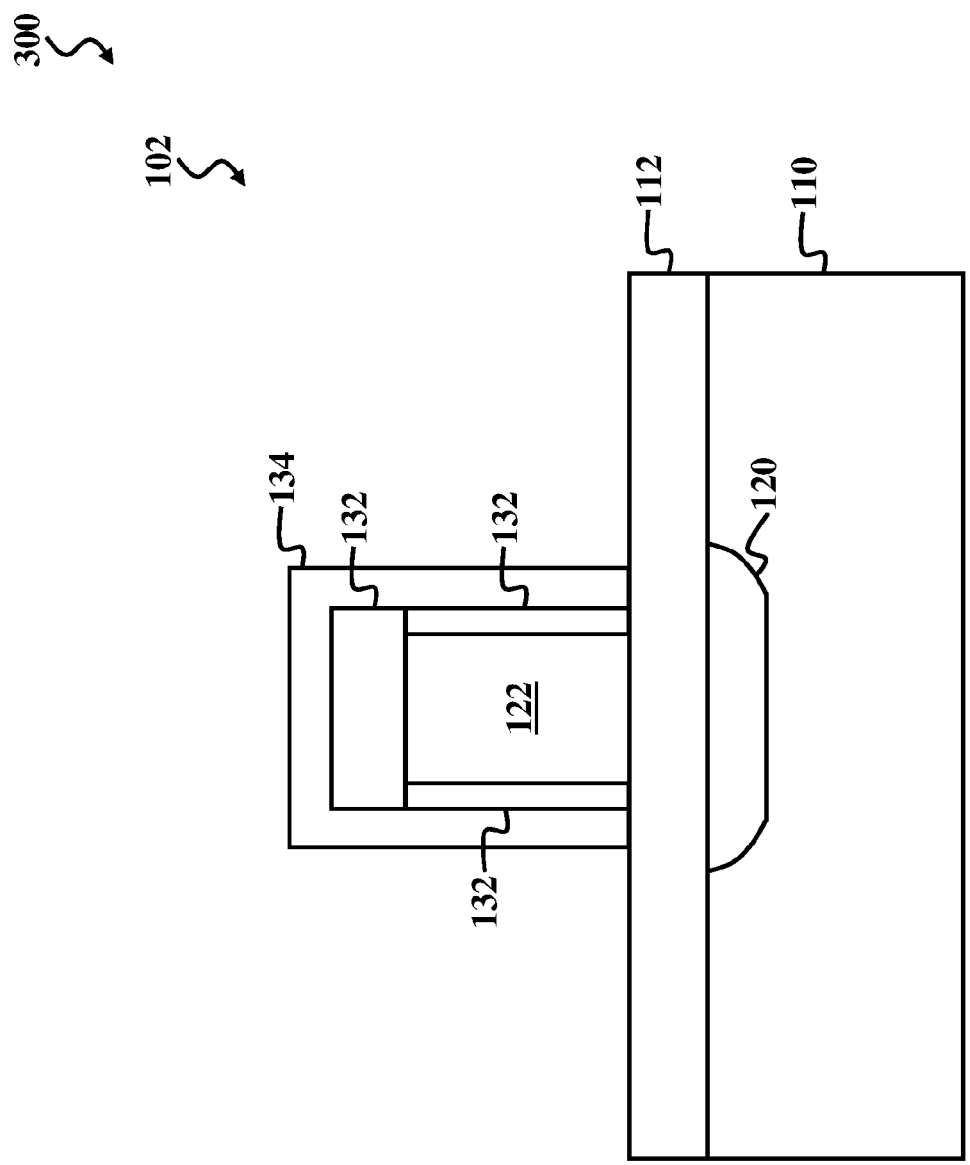

In FIG. 7, the charge storing layer 134 is formed over the fin structure 122. The charge storing layer 134 is formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods. In the depicted embodiment, a silicon nitride layer is deposited over the fin structure 122 and insulator layer 122 (for example, using a CVD process), and then etched to form the charge storing layer 134 remaining over the hard mask layer 124 and sidewalls of the fin structure 122 (in the depicted embodiment, adjacent to the gate dielectric layer 132).

Figure 8:
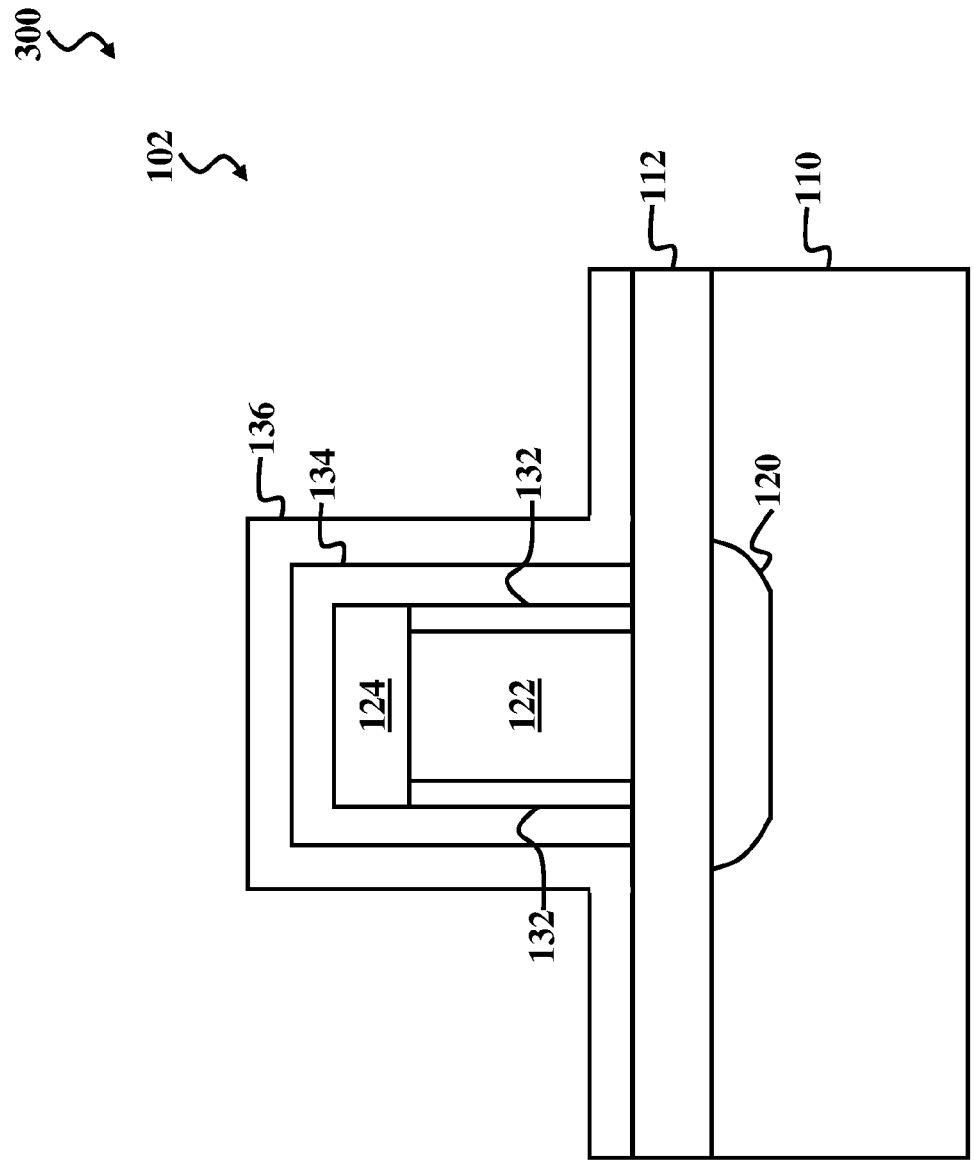
Figure 9:
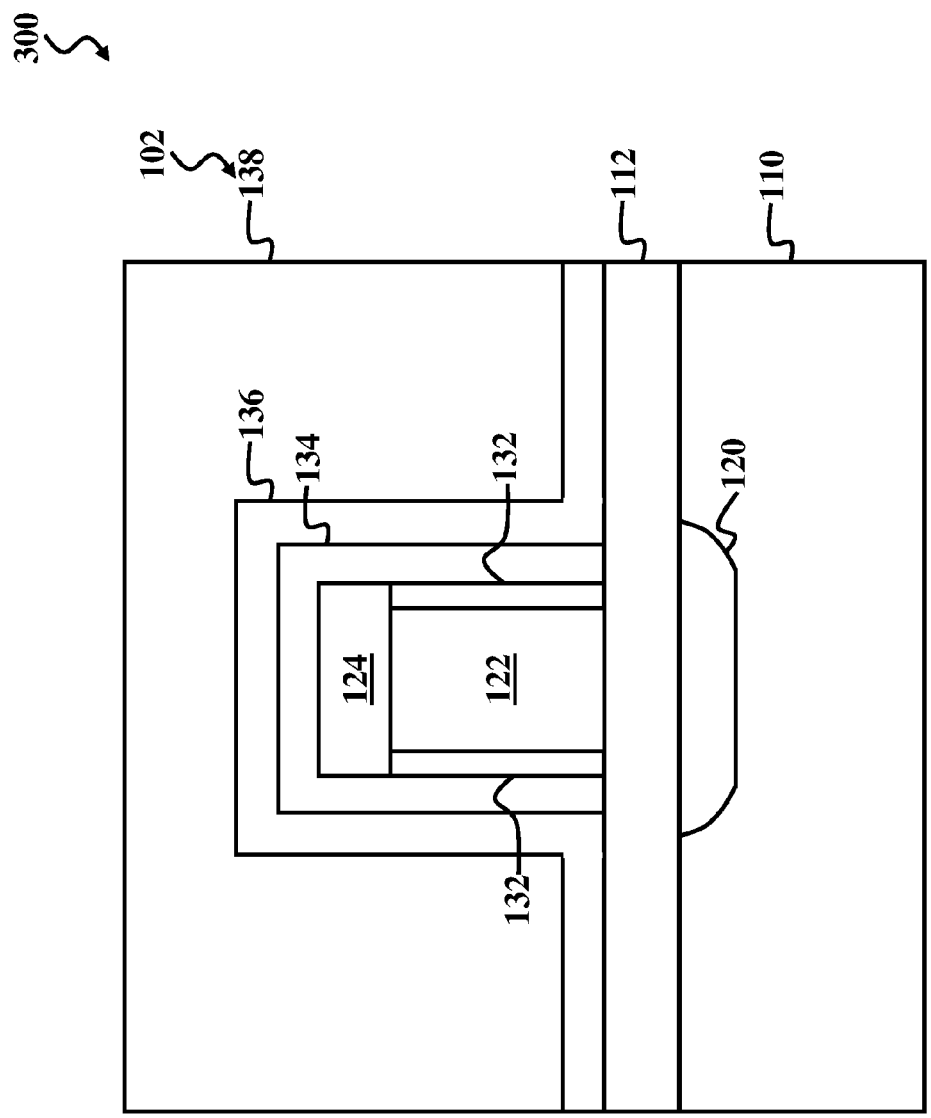

In FIGS. 8 and 9, the gate dielectric layer 136 is formed over the fin structure 122 and the insulator layer 112, and the gate electrode layer 138 is formed over the charge storing layer 134. The gate dielectric layer 136 and gate electrode layer 138 are formed by a suitable process, including deposition, lithography patterning, and etching processes. In the depicted embodiment, the gate dielectric layer 136 and the gate electrode layer 138 are formed by using a deposition process. The deposition processes include CVD, PVD, ALD, HDPCVD, MOCVD, RPCVD, PECVD, LPCVD, ALCVD, APCVD, plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

Figure 10:
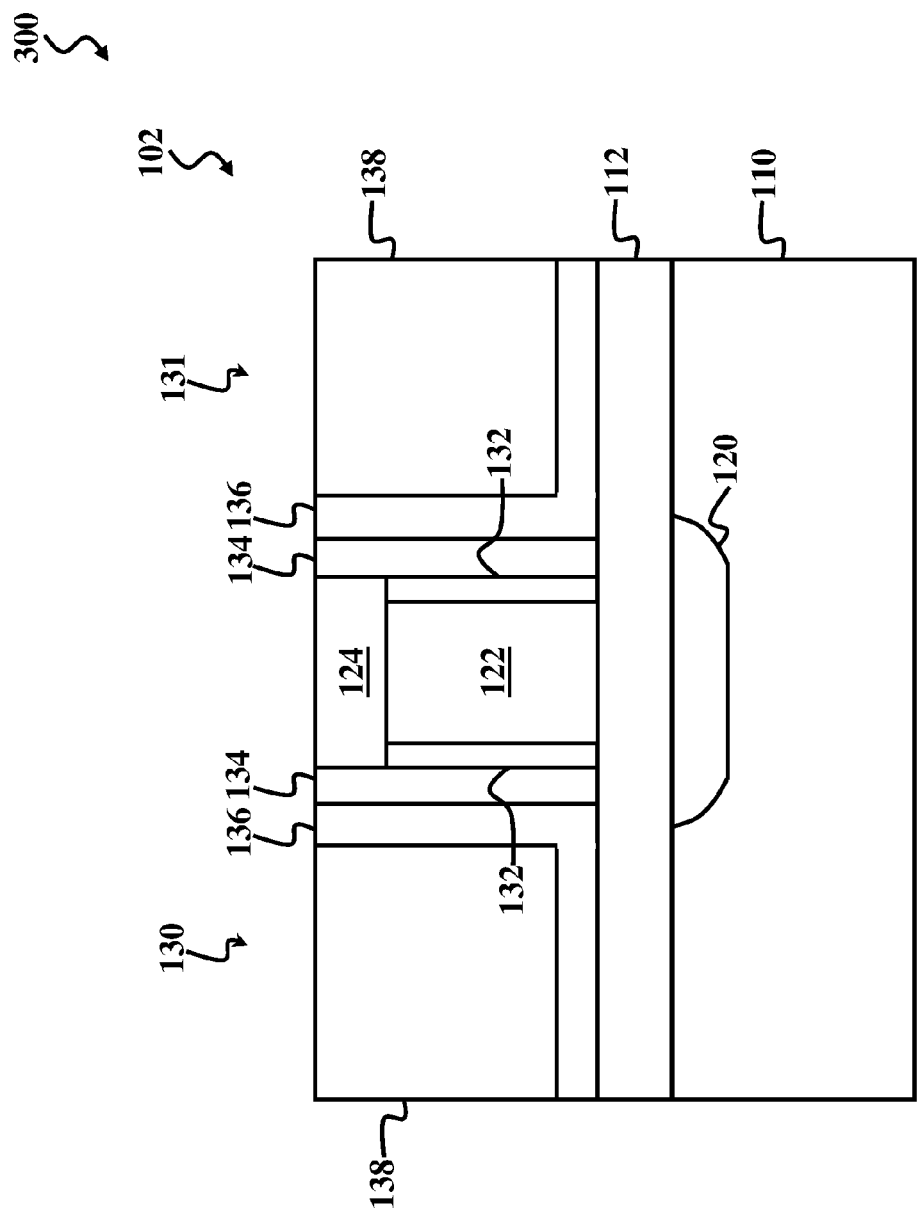

In FIG. 10, a chemical mechanical polishing (CMP) process is performed on gate electrode layer 138 until the hard mask layer 124 is reached. In the depicted embodiment, the CMP process thus removes the charge storing layer 134, the gate dielectric layer 136 and the gate electrode layer 138 from over the hard mask layer 124. Accordingly, the gate structures 130 and 131 are formed, which each include gate dielectric layer 132, charge storing layer 134, gate dielectric layer 136, and gate electrode layer 138.

Figure 11:
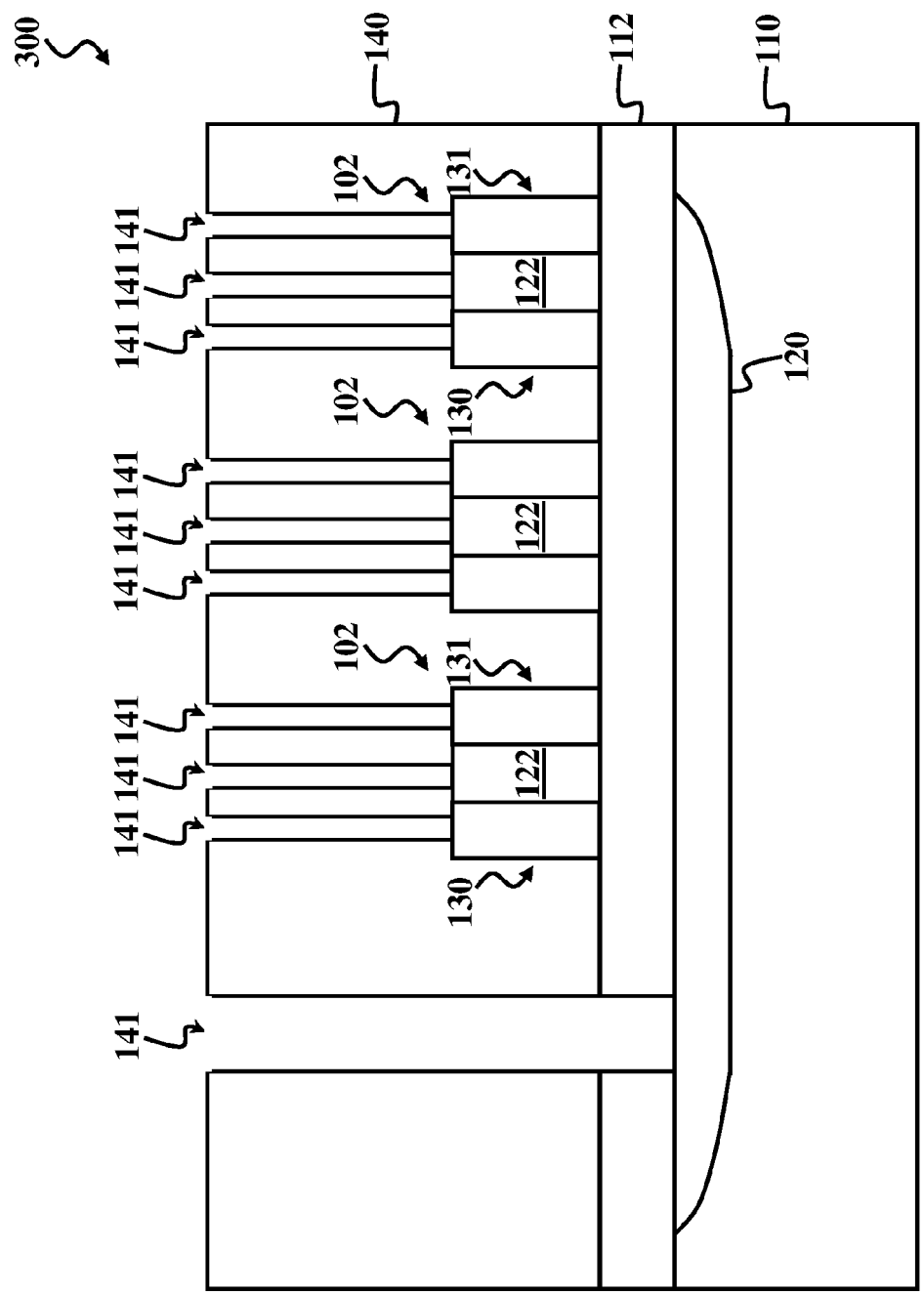
Figure 12:
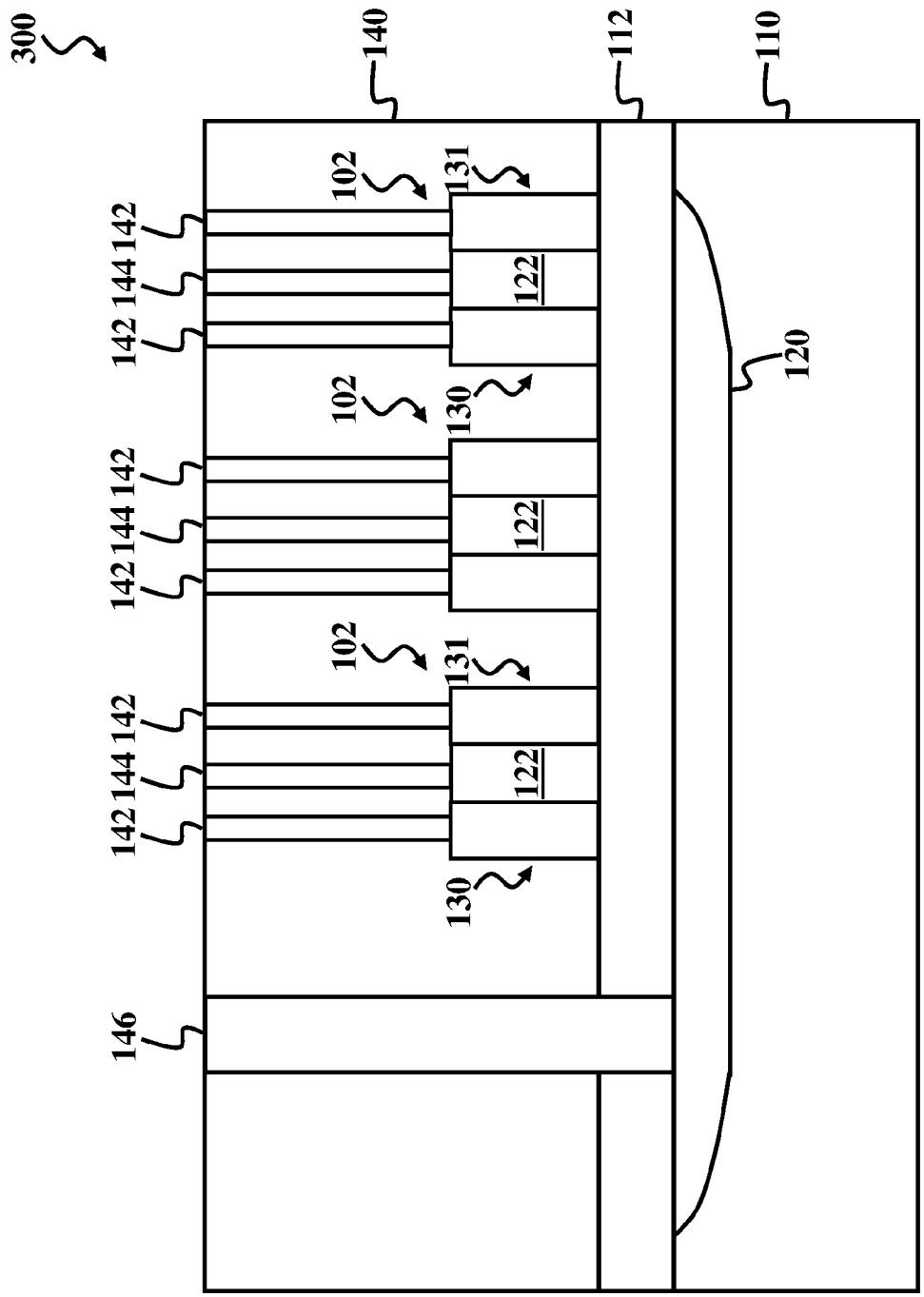

In FIGS. 11 and 12, contacts are formed to various features of the FinFET NVRAM device 300. For example, the dielectric layer 140 is formed over the insulator 112 and the FinFET NVRAM devices 102. A lithography patterning and etching process is then used to form openings 141 within the dielectric layer 140 that expose various features of the FinFET NVRAM devices 102. In the depicted embodiment, one of the openings 141 extends through the dielectric layer 140 and the insulator layer 112 to expose the doped region 120. Other openings 141 expose the gate structure 130, gate structure 131, source of the fin structure 122, and drain of the fin structure 122 of the FinFET NVRAM devices 102. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods. In FIG. 12, the openings 141 are filled with a conductive material to form the contacts 142, 144, and 146. The openings are filled using a deposition process, such as CVD, PVD, ALD, HDPCVD, MOCVD, RPCVD, PECVD, LPCVD, ALCVD, APCVD, plating, other suitable methods, or combinations thereof. A CMP process may be implemented after the deposition process to planarize the deposited conductive material.

It is understood that the fin structure 122 may include epitaxial features, such as strained source/drain features. For example, a semiconductor material may be epitaxially (epi) grown on the fin structure 122. The strained source/drain features are formed by a suitable process, such as an epitaxy or epitaxial (epi) process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 212 (e.g., silicon). In an example, the strained source and drain features include silicon germanium (SiGe), formed by a silicon germanium epitaxial deposition process. Alternatively, the strained source/drain features include silicon (Si). The strained source/drain features may be doped during its deposition (growth) by adding impurities to the source material of the epitaxy process or subsequent to its deposition growth process by an ion implantation process. For example, a silicon epi layer may be doped with phosphorous (to form a Si:P epi layer). The doped epitaxial layer may have a gradient doping profile. Subsequently, a CMP process may be performed to planarize the strained source/drain features. Prior to or after forming the strained source and drain features, implantation, diffusion, and/or annealing processes may be performed to form heavily doped source/drain (HDD) features.

The present disclosure provides for many different embodiments. In an example, a FinFET device includes a semiconductor substrate; an insulator layer disposed over the semiconductor substrate; a fin structure disposed over the insulator layer, the fin structure having a source region, a drain region, and a channel region disposed between the source region and the drain region; a gate structure disposed adjacent to the channel region of the fin structure, wherein the gate structure includes a first gate dielectric layer disposed adjacent to the fin structure, a second gate dielectric layer, a charge storing layer disposed between the first gate dielectric layer and the second gate dielectric layer, and a gate electrode layer disposed adjacent to the second gate dielectric layer; and a doped region disposed in the semiconductor substrate below the channel region of the fin structure, the doped region being electrically coupled with an erase line. The FinFET device may further include a contact that electrically couples the doped region to the erase line. The insulator layer may be a buried oxide layer. The first gate dielectric layer may be an oxide layer disposed along sidewalls of the fin structure, wherein the first gate dielectric layer is configured for a tunneling effect. The second gate dielectric layer may be one of a silicon oxide layer, silicon nitride layer, silicon oxynitride layer, and combination thereof. The charge storing layer may be one of a silicon nitride layer and a polysilicon layer. The gate electrode layer may include polysilicon.

In another example, a non-volatile random access memory (NVRAM) device includes a semiconductor substrate; an insulator layer disposed over the semiconductor substrate; a fin structure disposed over the insulator layer, the fin structure having a source region, a drain region, and a channel region disposed between the source region and the drain region; a first control gate disposed along one sidewall of the channel region of the fin structure; a second control gate disposed opposite the first control gate, the second control gate being disposed along another sidewall of the channel region of the fin structure; a first charge storing node and a second charge storing node, wherein the first charge storing node is disposed between the sidewall of the channel region of the fin structure and the first control gate, and wherein the second charge storing node is disposed between the another sidewall of the channel region of the fin structure and the second control gate; and an erase gate disposed in the semiconductor substrate below the channel region of the fin structure, wherein the erase gate includes a doped region disposed in the semiconductor substrate. The semiconductor substrate includes a first dopant type, and the doped region includes a second dopant type that is opposite the first dopant type. A contact extends through the insulator layer and is electrically coupled with the erase gate, the contact electrically coupling the erase gate with an erase line.

The NVRAM device may further include a first gate dielectric layer disposed between the first charge storing node and the sidewall of the channel region of the fin structure, and between the second charge storing node and the another sidewall of the channel region of the fin structure. The first gate dielectric layer is an oxide layer configured to provide a tunneling effect. The NVRAM device may further include a second gate dielectric layer disposed between the first charge storing node and the first control gate, and between the second charge storing node and the second control gate. In an example, the second gate dielectric layer disposed between the first charge storing node and the first control gate has a first portion extending along the first charge storing node, and a second portion extending from the first portion that is disposed between the first control gate and the insulator layer; and the second gate dielectric layer disposed between the second charge storing node and the second control gate has a third portion extending along the second charge storing node, and a fourth portion extending from the third portion that is disposed between the second control gate and the insulator layer. The first control gate and the second control gate may include polysilicon. The first charge storing node and the second charge storing node may include one of a nitride layer and a polysilicon layer. The insulator layer has a thickness that facilitates erasing of the first charge storing node and the second charge storing node when the erase gate is biased. In an example, the NVRAM device includes a first erase path includes the first charge storing node, the erase gate, and the insulator layer; and a second erase path includes the second charge storing node, the erase gate, and the insulator layer.

In yet another example, a method includes forming a doped region in a substrate, the doped region being disposed below an insulator layer of the substrate; forming a fin structure over the insulator layer and the doped region, the fin structure having a source region, a drain region, and a channel region disposed between the source region and the drain region, wherein the channel region of the fin structure is disposed over the doped region; and forming a gate structure adjacent to the channel region of the fin structure, wherein the gate structure includes a first gate dielectric layer disposed adjacent to the fin structure, a second gate dielectric layer, a charge storing layer disposed between the first gate dielectric layer and the second gate dielectric layer, and a gate electrode layer disposed adjacent to the second gate dielectric layer. The method further includes forming a contact that electrically couples the doped region to an erase line. In an example, the substrate is a silicon-on-insulator substrate having a first silicon portion, a second silicon portion, and the insulator layer disposed between the first silicon portion and the second silicon portion; and the forming the doped region in the substrate, the doped region being disposed below the insulator layer, includes performing an ion implantation process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET device comprising:
   a semiconductor substrate;
   an insulator layer disposed over the semiconductor substrate;
   a fin structure disposed over the insulator layer, the fin structure having a source region, a drain region, and a channel region disposed between the source region and the drain region;
   a gate structure disposed adjacent to the channel region of the fin structure, wherein the gate structure includes a first gate dielectric layer disposed adjacent to the fin structure, a second gate dielectric layer, a charge storing layer disposed between the first gate dielectric layer and the second gate dielectric layer, and a gate electrode layer disposed adjacent to the second gate dielectric layer; and an erase gate that is a doped region disposed in the semiconductor substrate below the channel region of the fin structure.

2. The FinFET device of claim 1 further including a contact that physically contacts the doped region to an erase line.

3. The FinFET device of claim 1 wherein the insulator layer is a buried oxide layer.

4. The FinFET device of claim 1 wherein the first gate dielectric layer is an oxide layer disposed along sidewalls of the fin structure, wherein the first gate dielectric layer is configured for a tunneling effect.

5. The FinFET device of claim 1 wherein the second gate dielectric layer is one of a silicon oxide layer, silicon nitride layer, silicon oxynitride layer, and combination thereof.

6. The FinFET device of claim 1 wherein the charge storing layer is one of a silicon nitride layer and a polysilicon layer.

7. The FinFET device of claim 1 wherein the gate electrode layer includes polysilicon.

8. The NVRAM device of claim 1 wherein:
a first erase path includes the first charge storing node, the erase gate, and the insulator layer; and
a second erase path includes the second charge storing node, the erase gate, and the insulator layer.

9. A non-volatile random access memory (NVRAM) device comprising:
a semiconductor substrate;
an insulator layer disposed over the semiconductor substrate;
a fin structure disposed over the insulator layer, the fin structure having a source region, a drain region, and a channel region disposed between the source region and the drain region;
a first control gate disposed along one sidewall of the channel region of the fin structure;
a second control gate disposed opposite the first control gate, the second control gate being disposed along another sidewall of the channel region of the fin structure;
a first charge storing node and a second charge storing node, wherein the first charge storing node is disposed between the sidewall of the channel region of the fin structure and the first control gate, and wherein the second charge storing node is disposed between the another sidewall of the channel region of the fin structure and the second control gate; and
an erase gate disposed in the semiconductor substrate below the channel region of the fin structure, wherein the erase gate is a doped region disposed in the semiconductor substrate.

10. The NVRAM device of claim 9 wherein the semiconductor substrate includes a first dopant type, and the doped region includes a second dopant type that is opposite the first dopant type.

11. The NVRAM device of claim 9 wherein a contact extends through the insulator layer and physically contacts the erase gate, the contact electrically coupling the erase gate with an erase line.

12. The NVRAM device of claim 9 further including a first gate dielectric layer disposed between the first charge storing node and the sidewall of the channel region of the fin structure, and between the second charge storing node and the another sidewall of the channel region of the fin structure.

13. The NVRAM device of claim 12 wherein the first gate dielectric layer is an oxide layer configured to provide a tunneling effect.

14. The NVRAM device of claim 12 further including a second gate dielectric layer disposed between the first charge storing node and the first control gate, and between the second charge storing node and the second control gate.

15. The NVRAM device of claim 14 wherein:
the second gate dielectric layer disposed between the first charge storing node and the first control gate has a first portion extending along the first charge storing node, and a second portion extending from the first portion that is disposed between the first control gate and the insulator layer; and
the second gate dielectric layer disposed between the second charge storing node and the second control gate has a third portion extending along the second charge storing node, and a fourth portion extending from the third portion that is disposed between the second control gate and the insulator layer.

16. The NVRAM device of claim 9 wherein the first control gate and the second control gate include polysilicon.

17. The NVRAM device of claim 9 wherein the first charge storing node and the second charge storing node is one of a nitride layer and a polysilicon layer.

18. The NVRAM device of claim 9 wherein the insulator layer has a thickness that facilitates erasing of the first charge storing node and the second charge storing node when the erase gate is biased.

19. The method of claim 18 further including:
forming a contact that electrically couples the doped region to an erase line.

20. A method comprising:
forming a doped region in a substrate through an insulator layer of the substrate such that the doped region is formed below the insulator layer;
forming a fin structure over the insulator layer and the doped region, the fin structure having a source region, a drain region, and a channel region disposed between the source region and the drain region, wherein the channel region of the fin structure is disposed over the doped region; and
forming a gate structure adjacent to the channel region of the fin structure, wherein the gate structure includes a first gate dielectric layer disposed adjacent to the fin structure, a second gate dielectric layer, a charge storing layer disposed between the first gate dielectric layer and the second gate dielectric layer, and a gate electrode layer disposed adjacent to the second gate dielectric layer.

21. The method of claim 20 wherein:
the substrate is a silicon-on-insulator substrate having a first silicon portion, a second silicon portion, and the insulator layer disposed between the first silicon portion and the second silicon portion; and
the forming the doped region in the substrate, the doped region being disposed below the insulator layer, includes performing an ion implantation process.

* * * * *